(12) United States Patent
Ramm

(10) Patent No.: US 6,835,414 B2
(45) Date of Patent: Dec. 28, 2004

(54) METHOD FOR PRODUCING COATED SUBSTRATES

(75) Inventor: Jurgen Ramm, Sevelen (CH)

(73) Assignee: Unaxis Balzers Aktiengesellschaft, Balzers (LI)

( * ) Notice: Subject to any disclaimer, the term of this patent is extended or adjusted under 35 U.S.C. 154(b) by 209 days.

(21) Appl. No.: 10/002,996

(22) Filed: Oct. 25, 2001

(65) Prior Publication Data

US 2003/0021895 A1 Jan. 30, 2003

(30) Foreign Application Priority Data

Jul. 27, 2001 (CH) .............................................. 1416/01

(51) Int. Cl.⁷ .............................................. C23C 16/00
(52) U.S. Cl. ...................... 427/248.1; 117/84; 117/88; 117/89; 117/90; 117/91; 117/92
(58) Field of Search .............................. 117/84, 88, 89, 117/90, 91, 92; 427/248.1

(56) References Cited

U.S. PATENT DOCUMENTS

| | | | |
|---|---|---|---|
| 4,058,430 A | 11/1977 | Suntola et al. .............. | 156/611 |
| 4,389,973 A | 6/1983 | Suntola et al. .............. | 118/275 |
| 4,413,022 A | 11/1983 | Suntola et al. ........... | 427/255.2 |
| 5,071,670 A | 12/1991 | Kelly ......................... | 427/38 |
| 5,656,238 A * | 8/1997 | Spencer et al. ............... | 422/23 |
| 5,916,365 A | 6/1999 | Sherman ...................... | 117/92 |
| 5,972,430 A | 10/1999 | DiMeo, Jr. et al. ....... | 427/255.3 |
| 6,015,590 A | 1/2000 | Suntola et al. ........... | 427/255.2 |
| 6,079,426 A * | 6/2000 | Subrahmanyam et al. ... | 134/1.1 |

OTHER PUBLICATIONS

Hiramatsu, K, et al., "Formation of TiN films with low CI concentration by pulsed plasma chemical vapor deposition", *J. Vac. Sci. Technol.* A 14(3) May/Jun. 1996, 1037–1040.

Rossnagel, S.M., "Plasma–enhanced atomic layer deposition of Ta and Ti for interconnect diffusion barriers", *J. Vac. Sci. Technol.* B 18(4), Jul./Aug. 2000, 2016–2020.

Swiss Search Report, dated Jul. 27, 2001.

* cited by examiner

*Primary Examiner*—Felisa C. Hiteshew
(74) *Attorney, Agent, or Firm*—Notaro & Michalos P.C.

(57) ABSTRACT

Method for producing substrates charged with materials, including placing the substrate into an evacuated vacuum container. The substrate is exposed to a reactive gas which is adsorbed on the surface. The surface with the adsorbed reactive gas is exposed to a low-energy plasma discharge with ion energy $E_{IO}$ on the surface of the substrate of $0 < E_{IO} \leq 20$ eV; and an electron energy $E_{eo}$ of $0 \text{ eV} < E_{eo} \leq 100$ eV. The adsorbed reactive gas is allowed to react at least with the cooperation of plasma-generated ions and electrons.

57 Claims, 5 Drawing Sheets

METHOD FOR PRODUCING COATED SUBSTRATES

FIELD AND BACKGROUND OF THE INVENTION

The present invention relates to a method for producing material-charged substrates in which a) at least one substrate is introduced into an evacuated vacuum container;
b) the surface of the substrate to be charged is exposed to a reactive gas which is adsorbed on the surface;
c) the exposure of the surface to the reactive gas is terminated,
d) the reactive gas adsorbed on the surface is allowed to react.

Such a method is prior known from U.S. Pat. No. 5,916,365. Therein a substrate is introduced into an evacuated vacuum container with a container wall comprised of ceramics, delimiting the process volume against the environment.

The surface to be coated of the substrate is exposed to a first reactive gas, which is adsorbed on said surface. The exposure of the surface to the reactive gas is terminated by subsequently pumping off the reactive gas.

A second reactive gas is subsequently introduced and, by means of a coil configuration provided outside of the vacuum container, an electromagnetic high-frequency field is generated in the container. Thereby at least a portion of the introduced second reactive gas is activated to form radicals, and the first reactive gas adsorbed on the surface, is allowed to react exclusively with said radicals generated by the effect of the high-frequency field.

The present invention addresses the problem of proposing a method of the above listed type, which builds on the deposition of a monolayer of atoms on the surface of the substrate to be coated, but has a substantially expanded flexibility of application with respect to the variety of monolayers which can be deposited.

SUMMARY OF THE INVENTION

We are herein addressing charging with materials for the reason that said monolayer does not need to be deposited as a continuous layer in the sense of a coating, but rather the density of deposited atoms can be far lower than is necessary for the formation of a continuous layer. But, if desired, the material charging can readily take place such that a continuous monolayer is formed, in this case in the sense of a coating.

This is attained according to the invention thereby that $d_1$) the surface with the adsorbed reactive gas is exposed to a low-energy plasma discharge with ion energy $E_{I0}$ on the surface of the substrate of $$0 < E_{I0} \leq 20 \text{ eV}$$

and an electron energy $E_{eo}$ of $$0 \text{ eV} < E_{eo} \leq 100 \text{ eV},$$

$d_2$) the adsorbed reactive gas is allowed to react at least with the cooperation of plasma-generated ions and electrons.

In contrast to said U.S. Pat. No. 5,916,365 where the adsorbed gas is exclusively allowed to react with radicals, which by definition are electrically neutral, according to the invention the reactive gas adsorbed on the surface is also allowed to react mildly through the effect of ions and electrons generated by low-energy plasma discharge. Therewith the feasibility is given of properly stabilizing the adsorbed gas also without effect of radicals of a further reactive gas on the surface, solely through "mild" interaction with low-energy inert gas ions and electrons or through such effect by other reactive gas ions.

Although the cited U.S. Pat. No. 5,916,365 explains that it was prior known to deposit thin coatings with the inclusion of a glow discharge in an atmosphere of a mixture of reactive gases, but which did not lead to satisfactory coating formation, in the course of the present description it will be explained how the plasma discharge employed according to the invention must be implemented in order, in addition to the generation of the effect of ions and electrons onto the adsorbed reactive gas or gas mixture, to activate in the plasma discharge also a second reactive gas or reactive gas mixture to form radicals and ions and to bring the adsorbed reactive gas or gas mixture additionally into interaction with the radicals generated by plasma activation, and per se electrically neutral radicals, as well as reactive gas ions.

Since in any event electrically charged particles participate in the reaction of the adsorbed gas, the reaction and in particular also its distribution can be controlled by electric and/or magnetic fields, whereby, however, the behavior of radicals alone would not be influenced.

In a preferred embodiment the ion energy $E_I$ on the surface of the substrate is further reduced to the range $$0 \text{ eV} < E_I \leq 15 \text{ eV}.$$

Further, the adsorbed reactive gas can also be a reactive gas mixture. The plasma discharge is furthermore, either maintained in an inert gas atmosphere, therein preferably in an argon atmosphere, or the plasma discharge is generated in an atmosphere which contains a further reactive gas or gas mixture. This further reactive gas or gas mixture preferably comprises at least one of the following gases:

hydrogen, nitrogen, oxygen, preferably hydrogen, or it consists of hydrogen gas.

In a further preferred embodiment of the method according to the invention the vacuum container is evacuated to a pressure $p_v$ for which applies:

$$10^{-11} \text{ mbar} \leq p_v \leq 10^{-6} \text{ mbar}.$$

This ensures that virtually no contaminants are deposited from the vacuum atmosphere into which the substrate is introduced, and disturb the surface.

In a further preferred embodiment the reactive gas or gas mixture, which is to be adsorbed on the surface, is introduced up to a partial pressure $p_p$ for which applies:

$$10^{-4} \text{ mbar} \leq p_p \leq 1 \text{ mbar}.$$

To a certain extent the quantity of the reactive gas or gas mixture adsorbed on the surface can be controlled by the time period between exposing said surface and terminating this exposure. It is essentially possible therein to assume an exponential function coursing towards a saturation value with a time constant characteristic for the dynamics of the saturating-out. This time constant can therein, if required, be controlled by heating or cooling the surface.

In a further preferred embodiment of the method according to the invention, the exposure of the surface to the reactive gas or reactive gas mixture to be adsorbed is terminated thereby that the substrate is transferred from the evacuated vacuum container with the reactive gas or gas mixture into a further evacuated vacuum container. The remaining process steps are completed in the further evacuated vacuum container. This has the advantage that a first vacuum container serves exclusively for the gas adsorption and therewith remains free of contamination, while the further vacuum container is employed for the plasma discharge reaction of the adsorbed gas.

In this approach it is possible, for example, to provide centrally a further vacuum container for the plasma discharge further treatment of the substrates, which previously had possibly adsorbed different reactive gases or reactive gas mixtures, in the specific "adsorption" container grouped about the central further vacuum container. Therewith complex coating systems comprised of even a multiplicity of different atom monolayers can be built layer by layer.

In many cases for the sequential deposition of differing or identical atomic monolayers in the central plasma reaction container using said low-energy discharge the same second reactive gas or reactive gas mixture can be employed, namely in particular preferred nitrogen and/or hydrogen and/or oxygen, therein in particular preferred is hydrogen. Conversely, it is also possible to assign several of the further vacuum containers for the reaction of the adsorbed reactive gases or gas mixtures in plasmas to an "adsorption" container, namely primarily when the adsorption step is shorter in time than the reaction step in the plasma.

In a further preferred embodiment of the method according to the invention, the exposure of the surface to the reactive gas or reactive gas mixture to be adsorbed is terminated by pumping out the remaining reactive gas or gas mixture from the evacuated vacuum container.

This pumping-out is therein preferably carried out until a total pressure $p_v'$ has been reached in the vacuum container, for which applies:

$$10^{-11} \text{ mbar} \leq p_v' \leq 10^{-8} \text{ mbar}.$$

Stated differently, for the termination of the reactive gas exposure the same pressure conditions are established again which obtained before the gas exposure, i.e. ultrahigh vacuum conditions.

If, as previously stated, the termination of the adsorption step is realized thereby that the substrate is transferred into a further vacuum container, apart from the partial pressure of the inert gas and/or partial pressure of a second reactive gas or gas mixture, said residual gas ultrahigh vacuum pressure ratios are there also adjusted.

The reaction of the adsorbed reactive gas or gas mixture with the cooperation of plasma-generated ions and electrons is not critical with respect to time due to the use of the low-energy plasma of said type. This process proceeds, at least approximately, again exponentially to an asymptotic value. If the plasma treatment is maintained at least during a predetermined minimum time period, this treatment can subsequently be further maintained without the generated atom monolayer, which in this case is continuous, to be significantly impaired. This has significant advantages for the automation and the timing of the method according to the invention, for example embedded in a complex sequence of additional surface treatment steps.

If the method according to the invention is terminated after the method step $d_2$), depending on the adsorption quantity (exposure time-controlled) and/or quantity of the gas atoms available for the adsorption as well as plasma effect (plasma treatment time and/or intensity) and/or utilization of a second reactive gas or gas mixture (radical and ion formation), an atom monolayer of different density up to a continuous atom monolayer is generated. If no continuous atom monolayer is targeted, the option is given of depositing virtually, in the sense of an implantation or vaccination technique, on the substrate surface or an already deposited continuous atom monolayer only "isolated" atoms of a type identical to those in the base or of a different type or of a different material.

In a further preferred embodiment of this method, at least the method steps b) to $d_2$) are run through at least twice whereby at least two atomic monolayers are deposited one above the other. Therein it is possible to change from monolayer to monolayer the surface-adsorbed reactive gases or gas mixtures, also to employ optionally second applied reactive gases or gas mixtures in the plasma discharge atmosphere, such that as a monolayer intentionally different layers can be deposited. If an epitaxial coating is intended, a hetero-epitaxial coating is generated. If in all layers the same material is deposited, homoepitaxy is generated with epitaxial growth.

Furthermore, it is in principle entirely possible to apply in a preferred embodiment after at least a one-time completion of step $d_2$), be that thus for the first time, or, with repeated-n-passes through cycles b) to $d_2$), a further material onto the surface resulting in this case, and specifically with any one of the known coating methods, be this with vacuum technique, wet chemistry or galvanically.

In a further, in particular preferred, embodiment of the method according to the invention, before said surface is exposed to the reactive gas or reactive gas mixture, this surface is exposed to a low-energy inert gas plasma, preferably an argon plasma, with an ion energy at said surface, for which applies:

$$0 \text{ eV} < E_{I1} \leq 20 \text{ eV}$$

preferably even of $$0 \text{ eV} < E_{I1} \leq 15 \text{ eV}$$

and at electron energies $E_{e1}$ of $$0 \text{ eV} < E_{e1} \leq 100 \text{ eV}.$$

Thereby defined surface conditions are generated at the subsequently gas-adsorbing surface.

In a further preferred embodiment of the method according to the invention, before exposing said surface to the reactive gas or reactive gas mixture to be adsorbed, the surface is exposed to a low-energy plasma discharge in an atmosphere which comprises a further reactive gas, where for the ion energy $E_{I2}$ on the substrate surface applies:

$$0 \text{ eV} < E_{I2} \leq 20 \text{ eV},$$

preferably applies $$0 \text{ eV} < E_{I2} \leq 15 \text{ eV}$$

and at electron energy $E_{e2}$ of $$0 \text{ eV} < E_{e2} \leq 100 \text{ eV}.$$

Here, on the one hand, defined surface conditions are also generated on the subsequently gas-adsorbing surface, and, additionally, said surface is cleaned. This takes place in particular with the preferred application, as the further reactive gas, of at least one of the gases hydrogen, nitrogen or oxygen. Especially preferred therein is the use of an atmosphere comprising hydrogen, preferably of an atmosphere which, optionally apart from an inert gas, such as in particular argon, is comprised of hydrogen.

In the following method steps will be considered, which are preferably carried out after the gas adsorption and the reaction of the adsorbed gas.

In an especially preferred embodiment, after the reaction of the adsorbed reactive gas or mixture, the surface is exposed to a low-energy inert gas plasma, preferably an argon plasma, with an ion energy $E_{I3}$ on the surface of $$0 \text{ eV} < E_{I3} \leq 20 \text{ eV},$$

preferably of $$0 \text{ eV} < E_{I3} \leq 15 \text{ eV}$$

and with an electron energy $E_{e3}$ of $$0 \text{ eV} < E_{e3} \leq 100 \text{ eV}.$$

In a further preferred embodiment of the method according to the invention, after said reaction of the adsorbed reactive gas, the surface is exposed to a low-energy plasma discharge in an atmosphere which comprises a further reactive gas or reactive gas mixture, where for the ion energy $E_{I4}$ on the substrate surface applies:

$$0 \text{ eV} < E_{I4} \leq 20 \text{ eV},$$

preferably $$0 \text{ eV} < E_{I4} \leq 15 \text{ eV}$$

and with electron energy $E_{e4}$, for which applies $$0 \text{ eV} < E_{e4} \leq 100 \text{ eV}.$$

Preferably as the further reactive gas at least one of the gases hydrogen, nitrogen or oxygen is here also employed, therein using in particular hydrogen.

By reaction of this further reactive gas, simultaneously also the inner surfaces of the vacuum container are cleaned.

If, as was explained above, for the reaction of the adsorbed reactive gas the plasma discharge is also maintained in a reactive gas or reactive gas mixture, in particular with at least one of the gases hydrogen, nitrogen or oxygen, highly preferred with at least a dominant fraction of hydrogen, then simultaneously the inner surfaces of the vacuum container are also cleaned, and specifically faster, cleaner and more defined than would be possible by pumping-out alone.

In particular by selecting the plasma treatment method preceding the reactive gas adsorption, the condition of the subsequently gas-adsorbing surface is at least also influenced. Therewith is also influenced whether or not an epitaxial deposition results, or an amorphous or polycrystalline one in the case of an uncleaned, amorphous, polycrystalline substrate surface. Through the substrate surface temperature the growth characteristic can also be influenced in this respect.

With the method according to the invention for the production of material-charged substrates, in an especially preferred manner the charging takes place by means of at least one of the following materials:
oxides or nitrides or oxinitrides of Si, Ge, Ti, Ta, Hf, Zr, Al, Nb, W and/or of the following metals:
Al, Ti, Cu, W, Ta or mixtures of said materials. Especially preferably said surface charging takes place with at least one of the materials:
silicon oxide, tantalum oxide, zirconium oxide, titanium nitride, tantalum nitride, tungsten nitride, $(TaSi)_xN_y$.

In a further, highly preferred embodiment of the method according to the invention, the process atmosphere surrounding the surface of the substrate during at least one of the phases, comprising steps b) and c) and/or d) to $d_2$), is isolated from the inner wall of a vacuum container disposed in the ambient surrounding. Consequently this isolation is carried out either while the surface to be coated is exposed to the reactive gas or gas mixture for adsorption—until the termination of this exposure—and/or during the reaction of the adsorbed gas.

The fundamental finding is therein that a functional isolation of structures, which ensures the required technical vacuum pressure ratios compared to ambient pressure, on the one hand, and of structures which are directly exposed to the treatment process, on the other hand, in view of the high requirements made of purity and/or optimum integratability of the method according to the invention entails significant advantages in an automated fabrication procedure.

If the surface of a substrate to be charged is being addressed and has been addressed, by that is to be understood also the surface of an already charged or coated substrate. The following example will be discussed for which the method according to the invention is especially suitable:

Let it be assumed that a substrate is coated with a dielectric, in particular $SiO_2$ coating. Through etching steps, which are not of further interest here, channels with a ratio of depth to width of, for example, 1:10 are sunk into the coating comprised of said dielectric materials, for example with a width of 50 nm. These channels are to be filled, for example galvanically, with an electrically conducting material, in particular with copper, in order to form so-called "interconnects". The deposition in particular of copper on dielectric surfaces is highly problematic in terms of adhesion. According to the invention onto the surface of the dielectric coatings, including the channels, a liner comprising only a few atom monolayers is deposited as a bonding layer between the dielectric material and the electrically conducting material. Due to its extremely low thickness, it impairs the conductor cross section of said interconnect channels only negligibly. Such bonding layers are known as liner coatings or "seed layers".

In a further preferred embodiment of the method according to the invention the substrate surface (optionally comprising the substrate coating surface) is cleaned before the adsorption step and/or after the reaction of the adsorbed reactive gas or gas mixture, by employing a plasma-enhanced cleaning step in which reactive gas or gas mixture, preferably comprising at least hydrogen, introduced into a cleaning process volume, is activated by means of a low-energy plasma discharge with an ion energy $E_r$ on the substrate surface of $$0 \text{ eV} < E_r \leq 20 \text{ eV},$$

preferably $$0 \text{ eV} < E_r \leq 15 \text{ eV}$$

at an electron energy $E_{er}$ of $$0 \text{ eV} < E_{er} \leq 100 \text{ eV}.$$

In a preferred embodiment, comprising this at least one cleaning step, of the method according to the invention, during the cleaning step the cleaning process atmosphere is isolated by means of a metallic encapsulation from the inner wall of a cleaning vacuum container at ambient surrounding, or—and this preferably—this process atmosphere is delimited directly by the inner wall of the cleaning vacuum container at ambient surrounding.

If it is taken into consideration that, as will yet be described, preferably the method phases, applied according to the invention, comprised of the steps b) and c), on the one hand, and/or d) to $d_2$) are carried out in a process atmosphere which is isolated by dielectric material from the conventionally metallic wall, which is at ambient pressure, it is evident that through the latter approach for said cleaning steps more cost-effective solutions can be applied. It must therein be observed that in particular a cleaning step before the initial exposure of the substrate surfaces to the reactive gas or reactive gas mixture to be adsorbed can lead to considerable contamination of the container wall.

As already indicated, in a preferred embodiment a single atom monolayer is deposited onto the surface by a single sequence of steps a) to $d_2$), optionally with specifically adjusted density up to a continuous layer. In a further preferred embodiment by repeating steps b) to $d_2$) a multilayer, for example epitaxial, coating is grown. If in each case the same reactive gas or reactive gas mixture to be adsorbed is employed, with a monocrystalline, cleaned surface, in the case of epitaxial growth this leads to a homoepitaxial coating. If the reactive gas to be adsorbed is changed in each instance after a predetermined number of deposited monolayers, this leads to extremely thin heteroepitaxial coatings.

In a further preferred embodiment of the method according to the invention, after carrying out a predetermined number of passes through steps b) to $d_2$) in particular sequentially on several substrates, the process volume of the vacuum container is subjected to a plasma-enhanced process volume cleaning step without a substrate being introduced or, optionally, with a substrate dummy in the vacuum container, which process volume cleaning step preferably first comprises an etching step, subsequently a cleaning step, preferably in a plasma with hydrogen, an inert gas or a mixture thereof.

In a further preferred embodiment of the method according to the invention, a substrate cleaning step is carried out before step a) and/or after step $d_2$ spatially separated from said vacuum container, wherein the transport of the substrate between said vacuum container and a cleaning container is carried out under vacuum.

It is therein preferred if at least piece-wise, this transport is realized such that it is linear or, especially preferably, along a circular path with linear guide movements to said containers, preferably with movement components which are radial with respect to the circular path.

In a further preferred embodiment of the method according to the invention, the process atmosphere during the phases comprising steps b) and c) and/or d) to $d_2$) is isolated from the inner wall of a vacuum container at ambient surrounding, and specifically by means of a surface, which in the new condition is chemically inert against the reactive gas or gas mixture to be adsorbed and/or against a second plasma-activated reactive gas or gas mixture, preferably by means of a dielectric or graphitic surface.

In a further preferred embodiment the inert surface is layed out as the surface of a partition wall, which along predominant area sections is spaced apart from the inner wall of the vacuum container. The surface for the isolation is preferably realized in the new condition of at least one of the following materials:

quartz, graphite, silicon carbide, silicon nitride, aluminum oxide, titanium oxide, tantalum oxide, niobium oxide, zirconium oxide or a layered combination of these materials, in this case also with diamond-like carbon or diamond.

In a further highly preferred embodiment of the method according to the invention, the plasma discharge is realized with an electron source with an electron energy $\leq 50$ eV, in particular preferred by means of a DC discharge.

This is preferably attained further by means of a thermionic cathode, preferably by means of a directly heated thermionic cathode.

Thereby that in the process volume of the vacuum container for said plasma discharge preferably at least two spatially offset anodes, preferably each heatable, are provided, preferably each separately electrically actuatable, and the electric potentials connected thereto and/or the anode temperatures are controlled or set, the plasma density distribution along the surface is adjusted or controlled statically or dynamically. In a further preferred embodiment the cathode-anode gap for the plasma discharge is disposed essentially perpendicularly and preferably centrally with respect to said surface.

In a further preferred embodiment of the method according to the invention, during the generation of the plasma discharge a magnetic field is generated in the process volume and the plasma density distribution along the surface is adjusted or controlled stationarily and/or dynamically by means of this field. The plasma density distribution is preferably at least locally wobbled, leading to an effect as if the substrate held stationarily in the plasma were moved with respect to the discharge.

Moreover, preferably at least the reactive gas or gas mixture to be adsorbed is introduced into the process volume such that it is distributed, preferably with an inflow direction substantially parallel to the substrate surface and, further preferred, with injection sites equidistant from the substrate surface. In an especially preferred embodiment of said method, the substrate is formed by a silicon oxide-coated substrate with channels sunk into the silicon layers, wherein after carrying out n-times the step $d_2$) copper is deposited into the channels. In every case n is therein greater than 1.

BRIEF DESCRIPTION OF THE DRAWINGS

In the following the invention will be explained in conjunction with Figures. Therein depict.

DESCRIPTION OF THE PREFERRED EMBODIMENTS

Figure 1:
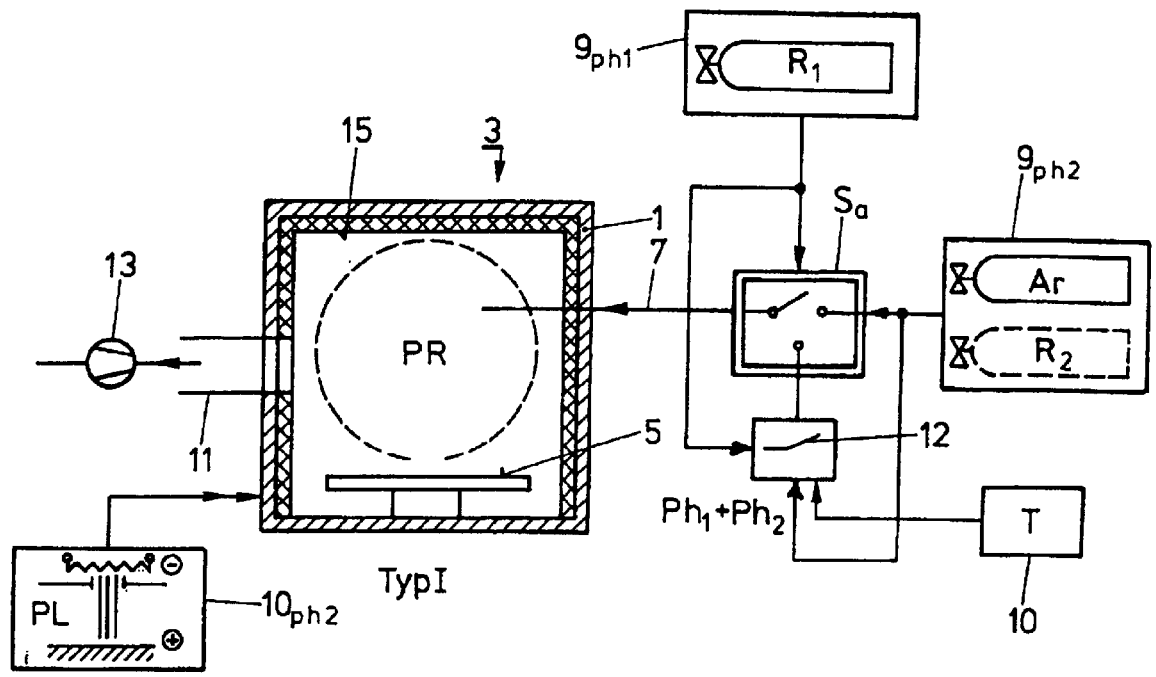
FIG. 1 schematically a first embodiment variant of a process module for carrying out the method according to the invention, in particular its phases $Ph_1$ and/or $Ph_2$, FIG. 2 in a representation analogous to that of FIG. 1, a preferred embodiment variant of the process module according to FIG. 1, FIG. 3 in a representation analogous to FIG. 1 or 2, a further type of process module for carrying out cleaning steps by the method according to the invention, FIG. 4 in a representation analogous to FIGS. 1 to 3, a modification of the process module depicted in FIG. 3, FIG. 5 simplified a preferred embodiment of a process module according to FIG. 2, convertible into a process module according to FIG. 3 or 4, FIG. 6 with respect to a nozzle axis A of the process module according to FIG. 5, the spatial and time modulation caused by the control of components of the magnetic field parallel to axis A over a plane E, perpendicularly to nozzle axis A, FIG. 7 by example and schematically a method according to the invention for multilayer realization, FIG. 8 a further embodiment of a method according to the invention with multilayer realization, and FIG. 9 in top view and simplified the combination of process modules according to FIGS. 1 to 5 to form a circular or cluster installation for carrying out the method according to the invention.

In FIG. 1 is schematically depicted a process module of type I preferably employed for carrying out the method according to the invention. A chamber wall 1 of a vacuum container 3 encompasses a process volume PR. In the process volume PR is provided a substrate carrier 5. The process volume PR is pumped down via a pumping connection 11, such as is shown schematically with vacuum pump 13, to the pressure $p_v$ required for carrying out the production method according to the invention of $$10^{-11} \text{ mbar} \leq p_v \leq 10^{-8} \text{ mbar}.$$

The structure of the container satisfies UHV conditions (for example metallic sealed vacuum vessel, heatable). The by far predominant surface region of the surface facing the process volume PR of chamber wall 1, which is conventionally comprised of stainless steel or Inox, is fabricated of an inert material as will be explained later. According to the embodiment depicted in FIG. 1 of the process module of type I, for this purpose the chamber wall 1 is coated on the inside with said inert material, or on the chamber wall 1 wall portions on the inside are mounted at least with inner surfaces comprised of said inert material. This coating or these inert material surfaces are denoted in FIG. 1 with 15.

As explained in the introduction, the production process according to the invention comprises two phases which do not necessarily need to be carried out in the same vacuum container, specifically Phase 1, $Ph_1$: exposing the substrate surface to a reactive gas or reactive gas mixture until the termination of this exposure, Phase 2, $Ph_2$: exposing the substrate surface to a low-energy plasma discharge and thus reaction of the adsorbed reactive gas.

With the development of the plasma discharge in $Ph_2$ as a low-energy plasma discharge with ion energies E as specified above, the atmosphere in which the plasma discharge is maintained can contain a second reactive gas or reactive gas mixture, in particular preferred hydrogen and/or nitrogen and/or oxygen.

The process module of type I depicted in FIG. 1 is excellently suitable for carrying out phase $Ph_1$ and/or phase $Ph_2$. According to FIG. 1, as shown schematically, a gas supply line 7 leads into the process volume PR of the vacuum container 3. As schematically shown with a selection switch $S_a$, the supply line 7 is connected solely for carrying out phase $Ph_1$ in container 3 with a gas tank configuration $9_{ph1}$, which contains the reactive gas or reactive gas mixture $R_1$ to be adsorbed by the substrate surface.

If, in contrast, the vacuum container 3 is employed exclusively for carrying out phase $Ph_2$, the supply line 7 is connected to a gas tank configuration $9_{ph2}$, which contains, on the one hand, an inert gas, preferably argon Ar, and/or—as indicated with the dashed line—a second reactive gas $R_2$, preferably hydrogen, oxygen and/or nitrogen.

If in vacuum container 3 phase $Ph_1$ as well as also phase $Ph_2$ are carried out, then as depicted with the time control unit 10 and the change-over switch 12 in FIG. 1, in a predetermined time sequence gas tank $9_{ph1}$ as well as also $9_{ph2}$ are connected to the supply line 7.

Furthermore, in vacuum container 3, as shown in block $10_{ph2}$, a plasma discharge gap PL, namely a low-energy plasma discharge gap, is provided if $Ph_2$ alone or combined with $Ph_1$ is carried out in vacuum container 3. Reference is made to the representation in FIG. 1, according to which the double arrow to the block $10_{ph2}$ indicates the integration of the plasma discharge gap into container 3 and block $S_a$, represented with a double line, indicates that this block represents schematically alternatives in the realization of the process module of type I.

After a substrate has been placed onto substrate carrier 5, in phase $Ph_1$ via the supply line 7 the reactive gas or reactive gas mixture $R_1$ is allowed to flow in and be adsorbed by the surface of the substrate. The substrate is subsequently transferred to phase $Ph_2$, be that in the same container 3 or a correspondingly developed further container 3. To terminate the adsorption process, the container 3, employed for both phases, is at any rate again pumped down to the specified ultrahigh vacuum conditions or it is the further container which is pumped down or becomes pumped down to this ultrahigh vacuum before the substrate with the adsorbed gas is introduced. Subsequently inert gas, preferably argon Ar, is allowed to flow in and/or the further reactive gas and the low-energy plasma discharge, in particular preferred a DC discharge, is set up. In the DC discharge, furthermore preferred, a non-self-sustaining discharge is employed, preferably with a thermionic cathode, preferably with a directly heated thermionic cathode.

By the specific and intentional control of the time period during which the substrate is exposed to the reactive gas $R_1$ or the reactive gas mixture in phase $Ph_1$, and/or of its surface composition and/or of the supplied reactive gas or reactive gas mixture quantity, the degree of coating of the surface of the substrate with adsorbed gas atoms or molecules can be specifically controlled.

In this phase $Ph_1$ preferably reactive gas or reactive gas mixture is allowed to flow in at a partial pressure $p_p$ for which applies $$10^{-4} \text{ mbar} \leq p_p \leq 1 \text{ mbar}.$$

Moreover, the adsorption rate, i.e. the time period which is required until the substrate surface is saturated out to a predetermined percentage with reactive gas or reactive gas mixture atoms or molecules, can be controlled by (not shown) heating and/or cooling of the substrate surface through the corresponding heating and/or cooling of the substrate carrier 5.

As had already been explained in the introduction, in phase $Ph_2$ the gas adsorbed on the surface of the substrate is allowed to react in any event with the cooperation of gas ions and electrons, optionally also by means of radicals formed in the plasma discharge, of a second reactive gas or reactive gas mixture $R_2$. Through the corresponding dimensioning of the time period during which the substrate surface with the adsorbed gas is exposed to the plasma discharge as well as of the energy of the gas ions and electrons, and thus to the discharge as well as the quantity of optionally provided radicals and their activity, it is also possible in this phase $Ph_2$ to control also the quantity of "stabilized", previously adsorbed gas atoms or molecules and thus the degree of coating resulting lastly of the surface with atoms or molecules. In most cases the intent is realizing a continuous monomolecular or monoatomic monolayer on the substrate surface, thus with one hundred percent saturation, at which atom is in contact with atom or molecule with molecule.

As the material of the surface 15 facing the process volume PR according to FIG. 1 is preferably employed a dielectric material. Depending on the method phases for which the vacuum container 3 is employed, it must be inert against the reactive gas or reactive gas mixture $R_1$ and/or against the plasma-activated second reactive gas or reactive gas mixture $R_2$ optionally used in phase $Ph_2$.

For this surface 15 is preferably applied at least one of the materials listed in the following group G:

quartz, graphite, silicon carbide, silicon nitride, aluminum oxide, titanium oxide, tantalum oxide, niobium oxide, zirconium oxide, diamond-like carbon or diamond, the latter surface materials as coating materials.

Figure 2:
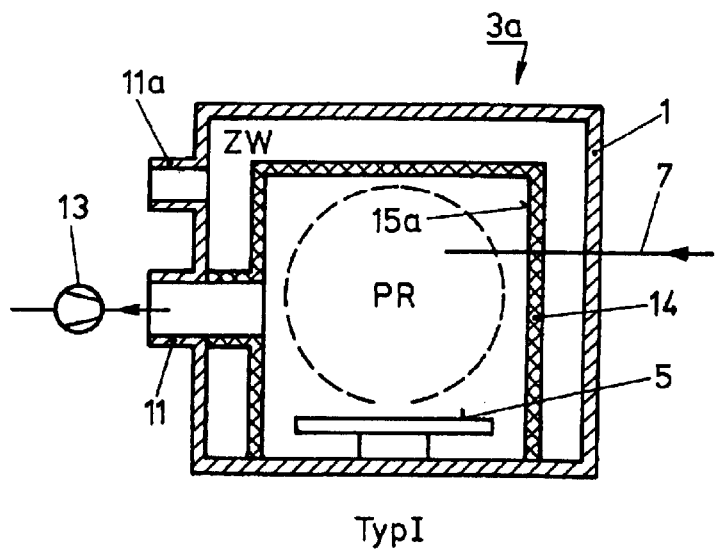

In FIG. 2 is shown in a representation analogous to that of FIG. 1, further schematically, a preferred embodiment of the process module according to FIG. 1 of type I according to the invention. With respect to process operation, provided gas supplies as well as optionally provided plasma discharge gaps, the explanations made in connection with FIG. 1 apply identically, also with respect to the method operation. In FIG. 2 the same reference symbols are used for the parts already described in FIG. 1. In contrast to the embodiment according to FIG. 1, in the embodiment according to FIG. 2 the process volume PR is further delimited by a process volume wall 14 spaced apart along predominant sections of the chamber wall 1, furthermore preferably comprised of stainless steel or Inox. At least its surface 15a facing the process volume PR is fabricated of the inert material already described in connection with FIG. 1, as stated preferably of a dielectric material, preferably furthermore of at least one of the materials of group G.

The wall 14 proper, forming a process volume encasing within the vacuum chamber with wall 1, can therein comprise the material forming surface 15a, or the inert material forming surface 15a is built up on a bearing wall (not shown) facing wall 1, such as for example built up of coatings. This bearing wall in this case, since it is not exposed to the process volume PR, is preferably for example of a stainless steel or Inox. Through the pumping connection 11 or the pump 13 the process volume PR is pumped down to the partial pressure of the residual gas explained in connection with FIG. 1 while, for example, as shown in FIG. 2, the interspace ZW between vacuum chamber wall 1 and encasing 14 is pumped down via a separate pumping connection 11a by the same or by another vacuum pump.

It is readily apparent to a person skilled in the art that even when employing the same pump 13 for pumping out both volumes, namely the process volume PR as well as the interspace ZW, corresponding controllable choke members can be installed in the associated pump connecting pieces 11 or 11a. With respect to the low-energy plasma which is also applied for carrying out phase $Ph_2$ of the method according to the invention, in the module according to FIG. 2, the explanations apply which were already offered in connection with FIG. 1. The process volume encasing formed by the wall 14 and provided in the embodiment according to FIG. 2, is preferably implemented on the container 3a such that it is exchangeable.

Figure 3:
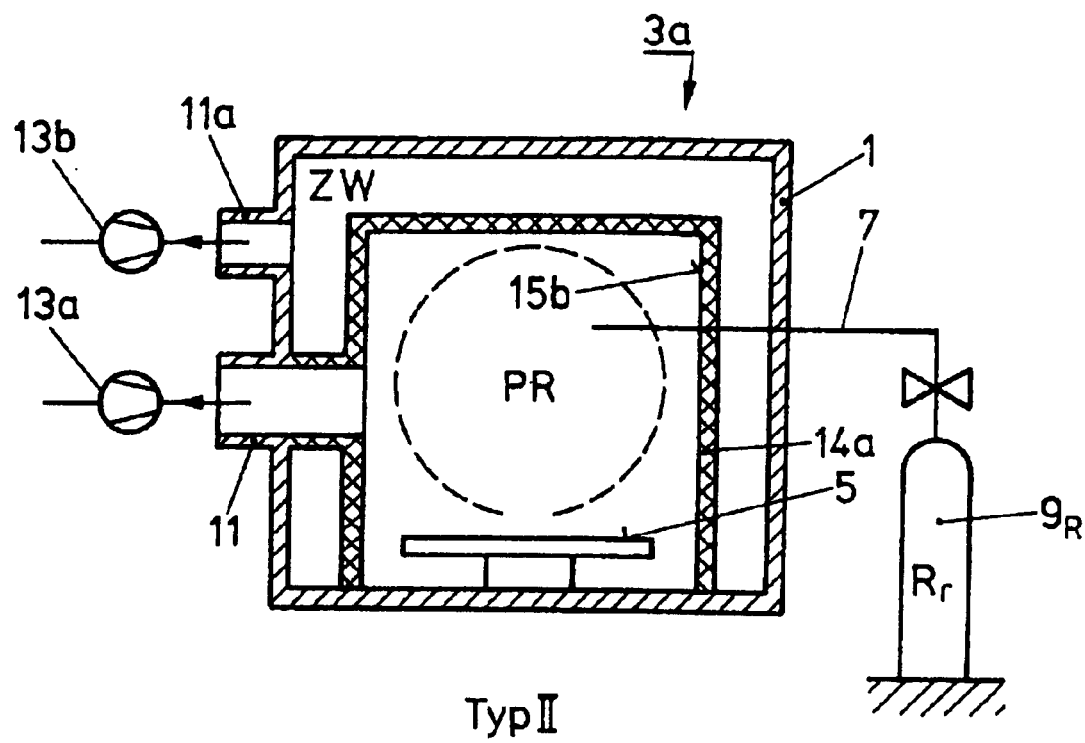
Figure 4:
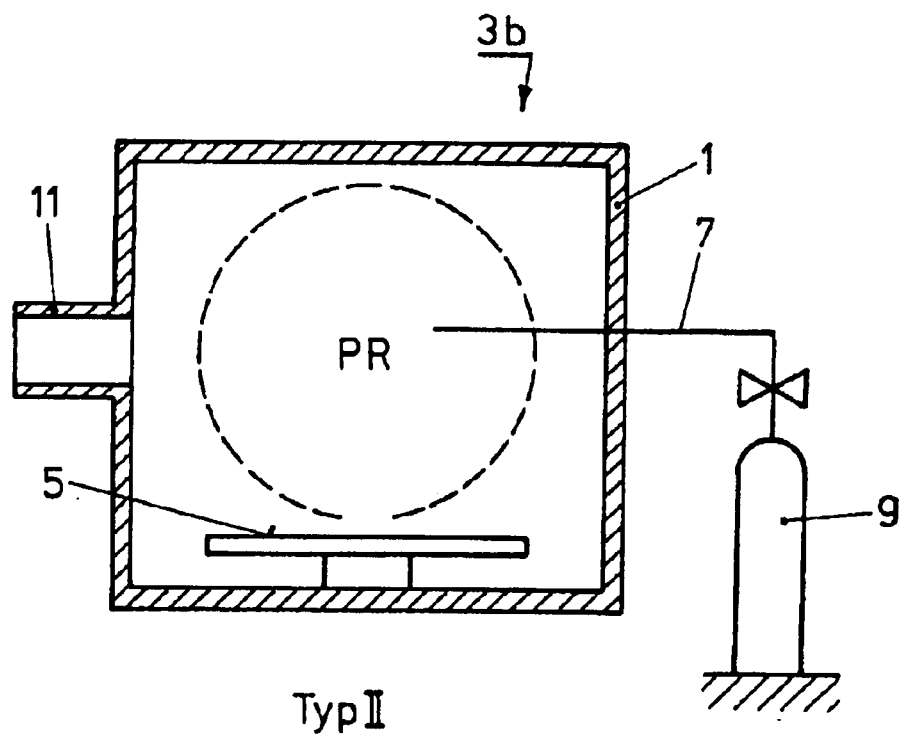

The process module of type II, which will be explained in the following and is depicted in FIGS. 3 and 4, is preferably applied within the production method according to the invention as a cleaning module. As had been explained in the introduction, it is highly advantageous to condition or to clean the substrate surface before it is supplied to the gas adsorption. This takes preferably place with plasma-activated reactive gas or reactive gas mixture, preferably by means of plasma-activated hydrogen. Here also a low-energy plasma is used which has ion energies $E_r$ on the substrate surface in the above stated range. As the plasma discharge is therein preferably applied a DC discharge, especially preferred a non-self-sustaining discharge. As a preferred embodiment variant, again, a discharge with thermionic cathode, especially preferred with directly heated thermionic cathode, is employed.

Apart from providing such a substrate surface conditioning or cleaning step before the gas adsorption phase $Ph_1$, in particular before the initial one, it can also be appropriate to provide such a surface treatment step after completion of the above defined phase $Ph_2$ of the method according to the invention. As stated, for this purpose preferably the process modules of type II according to FIG. 3 or 4 are applied which will be explained subsequently.

The module depicted in FIG. 3 differs from those depicted in FIG. 2 only thereby that the surface 15b encompassing process volume PR does not meet the requirements of being inert, explained in connection with the process module according to FIG. 2, in that the wall 14a, for example, like wall 1 is fabricated of stainless steel or Inox or another metal. The gas tank configuration $9_R$ contains a reactive gas or reactive gas mixture $R_r$ employed in particular for purposes of cleaning, and in container 3a (not shown) low-energy plasma discharge gap satisfying the above requirements is provided.

The metallic wall 14a is preferably exchangeable such that the process module of type II in the embodiment according to FIG. 3 can be readily converted into a process module of type I according to FIG. 2 and conversely.

In FIG. 4, furthermore in a representation analogous to FIGS. 1 to 3, a further simplified embodiment of the module of type II is depicted. In contrast to the explanations made in conjunction with FIG. 3, here the process volume PR is directly delimited by chamber wall 1 having a surface which comprises, for example, stainless steel or Inox.

It is readily evident that the modules of type I according to FIG. 1 or FIG. 2, and of type II according to FIG. 3 or 4, can be converted one into the other by the corresponding removal or application of process volume encasing 14, 14a.

Figure 5:
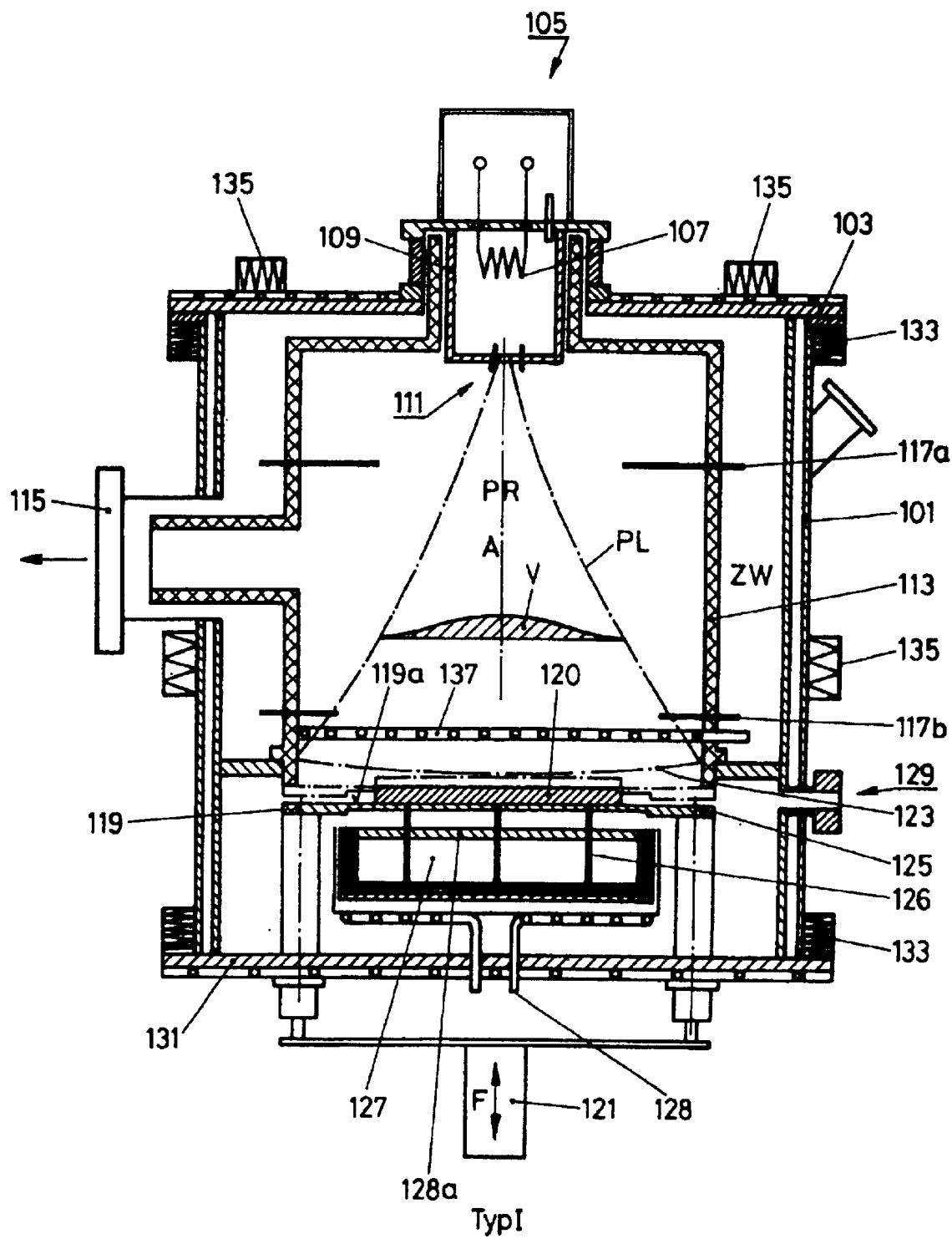

In FIG. 5 is depicted a preferred realization of a type I process module according to FIG. 2. It should be pointed out that all measures developed from the module according to FIG. 2, additionally and specifically preferably employed in the module according to FIG. 5, can be realized on the principle according to FIG. 2 individually or in any desired partial combinations. The process module according to FIG. 5 is layed out such that both phases $Ph_1$ and $Ph_2$ of the production method according to the invention can be carried out thereon.

The timing ratios are also correspondingly driven under time control and the gas supplies dependent of phase.

The container wall 101 of the process module according to FIG. 5, preferably fabricated of stainless steel or Inox, supports centrally, preferably at its upper front plate 103, an electron source 105 for cooperating in the generation of the plasma discharge in process volume PR in phase $Ph_2$ of the production method according to the invention. Within the framework of the low ion energies, required according to the invention, in the substrate vicinity, also for the employment of a second reactive gas or reactive gas mixtures in phase $Ph_2$, other plasmas can optionally be applied, such as for example microwave plasmas, as will be described in the following.

An electron source, such as the electron source 105, is preferably employed which emits electrons with an electron energy of maximally 100 eV, preferably of maximally 50 eV. In a preferred embodiment the non-self-sustaining discharge with the electron source is therein realized as a DC discharge. The electron source 105 according to FIG. 5 is preferably formed by a thermionic cathode, preferably a directly heated thermionic cathode 107 built into a cathode chamber 109, with a cathode chamber wall electrically insulated from container wall 101, 103. The cathode chamber communicates via a nozzle 111 with the process volume PR. The inert gas, preferably argon, employed in phase $Ph_2$ is further preferably (not shown) allowed to flow into cathode chamber 109, inter alia in order to protect the thermionic cathode 107 against the effects of a second reactive gas or reactive gas mixture optionally also employed in phase $Ph_2$ and to make possible an increased electron emission rate.

Spaced apart from the container wall 101, 103 and with it fixing interspace ZW, encompassing the process volume PR is mounted the process volume encasing 113 such that in analogy to FIG. 2 it is preferably exchangeable. The process volume PR within encasing 113 as well as the interspace ZW are here pumped via the same pumping connection 115. Therein optionally different pumping cross sections can lead from this connection 115, on the one hand, to interspace ZW, on the other hand, to process volume PR.

Within process volume PR acts an anode configuration for the method phase $Ph_2$. This is preferably formed by two or several anodes 117a or 117b disposed concentrically with the nozzle axis A. They can (not shown) each independently of the other be connected to ground potential or to particular electric anode potentials, which, further preferred, can be adjusted independently of one another. Further preferred the metallic container wall 101, 103 is connected to reference potential, preferably ground potential. The anodes 117a, 117b, offset along the nozzle axis A, in addition to being electrically operatable independently of one another, are also preferably (not shown) heatable or coolable independently of one another. This is realized thereby that lines for temperature-conditioning media are carried and/or heating coils are installed in these anodes.

The plasma beam PL formed by the preferably employed plasma generation configuration is shown in dot-dash line with a plasma density distribution, drawn at V purely heuristically, coaxially with respect to the nozzle axis A. In phase $Ph_2$ the substrate surface with the absorbed reactive gas is directly exposed to the plasma discharge PL. Through the corresponding impression of anodes 117a and 117b with anodic potentials or by controlled temperature-conditioning of these anodes, the plasma density distribution V can be adjusted specifically in particular via the substrate surface at least approximately with constant distribution.

In process volume PR a substrate retainer 119 is mounted or, as will yet be explained, supplied under control to process volume PR. Although it is entirely possible to dispose the substrate retainer 119 for the preferred treatment of disk-shaped substrates 120, defining a carrier surface 119a, with this carrier surface 119a parallel to nozzle axis A, with respect to it at oblique angles or, with respect to it according to FIG. 5 perpendicularly but eccentrically, in a more preferred embodiment substrate retainer 119 is disposed with its carrier surface 119a concentrically with axis A of nozzle 111 and substantially perpendicularly.

In a further preferred embodiment by means of an external drive 121 the substrate retainer 119, as indicated with the double arrow F, can be moved toward the internal receiving opening 123 which is defined by the encasing 113, or again away from it. After the substrate retainer 119 has been moved up by means of drive 121 completely toward the process volume PR, its margin portion 125 closes the internal opening 123 of the process volume encasing 113 at least such that in phase $Ph_2$ charge carriers are prevented from exiting from process volume PR and in the method phase $Ph_1$ it is sustainingly prevented that reactive gas or reactive gas mixture to be adsorbed exits into the interspace ZW.

A substrate 120, as stated preferably planar or disk-shaped, is deposited through a slot valve 129 onto stationary receiving struts 126 while the substrate retainer 119 is lowered. The substrate retainer 119 is subsequently raised and with its carrier surface 119a extends under the substrate 120 and lifts it from the stationary strut 126. The substrate 120 is moved upwardly into process volume PR, therewith upon reaching the working position the substrate retainer 119 closes the process volume to said extent with its margin surface 125.

The struts 126 are mounted on a substrate temperature-conditioning device 127, which via inlet and outlet lines 128, conducting temperature-conditioning media, is acted upon with temperature-conditioning media. As stated, through the corresponding control of the substrate surface temperature, in particular in phase $Ph_1$, the rate of gas adsorption can be controlled.

The substrate retainer 119 is depicted in dashed lines in FIG. 5 in its working position.

The container wall 101 and its front-side closure plates 103 or 131 are temperature-conditioned, preferably cooled, in particular in phase $Ph_2$ of the production method according to the invention. For this purpose, the wall 101 forming the encasing is developed as a double wall with a temperature-conditioning medium system installed in-between. In the front plates 103 or 131 are also installed line systems for temperature-conditioning media.

Figure 6:
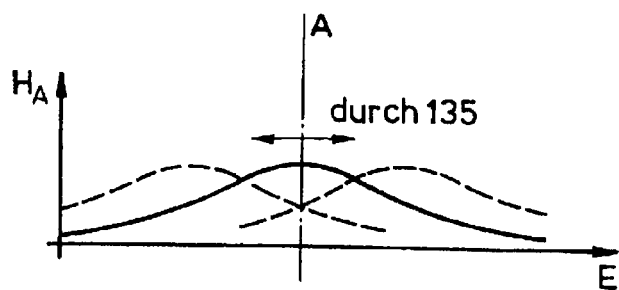

Outside of the vacuum container are mounted Helmholtz coils 133 as well as distributed deflection coils 135. By means of the Helmholtz coils 133 a magnetic field pattern, substantially parallel and symmetric with respect to it, is generated in process volume PR, in particular in phase $Ph_2$ of the production method according to the invention. This magnetic field pattern can be shifted with the aid of the deflection coils 135 in planes E perpendicular to axis A, as shown schematically in FIG. 6. Through this "shifting" of the magnetic field strength distribution $H_A$ a "shifting" of the plasma density distribution V along the substrate 120 results. Therewith a "relative motion" between plasma density distribution V and the substrate surface to be treated is attained as if the substrate with respect to plasma PL were shifted with a plasma density distribution constant in time. Through this control of the field distribution, at the substrate consequently the same effect results as if it were moved mechanically with respect to plasma PL, but without providing a mechanical substrate movement.

For the realization of phase $Ph_1$ of the method according to the invention, reactive gas or reactive gas mixture to be adsorbed, after the substrate 120, preferably previously cleaned, has been moved into the working position, is allowed to flow via reactive gas inlet 137 into the process volume PR. Therein, as shown, the reactive gas inlet is disposed coaxially with axis A, in the immediate proximity of the substrate 120 or substrate carrier 119 in the working position, with inlet openings substantially parallel to the substrate surface to be treated. As has been stated, the vacuum container 101, 103 preferably built of stainless steel, is intensively cooled especially in phase $Ph_2$. It fulfills UHV requirements. The intensive cooling in phase $Ph_2$ prevents the heating of the steel and the freeing of carbon-containing gases entailed therein from the steel, in particular during phase $Ph_2$.

With respect to the material of the process volume encasing 113, in particular of the surface exposed to the process, the explanations offered already in conjunction with FIG. 1 apply: the inert material, preferably a dielectric and, as stated, preferably selected from the material group G, even under substantially higher temperatures than the process temperature, is stable with respect to the applied reactive gases $R_1$ to be adsorbed (FIG. 1) and the second reactive gases ($R_2$) optionally supplied to the plasma discharge atmosphere in phase $Ph_2$, such as in particular with respect to hydrogen, silane, germane, diborane, chlorine, $NF_3$, HCl, $SiH_3CH_3$, $GeH_3CH_3$, $N_2$, $ClF_3$, $PH_3$, $AsH_4$. Therewith is attained that no contamination of the substrate 120 occurs. An interfering coating of the interior surface of the process volume encasing 113 is only critical under the aspect of particle formation. A thin interfering coating through gas adsorption and subsequent plasma treatment can even be preferred in order to ensure an even higher purity of the process which is subsequently virtually encompassed exclusively by material inherent to the process.

In type I process modules the vacuum chamber wall, conventionally of stainless steel, is not coated since it is protected by the process volume encasing 113 against the reactive gases and the plasma, since further the intensive cooling depicted in FIG. 5 strongly reduces there a precipitation from the gas phases. That which applies with respect to the interior surface of the process volume encasing 113, applies also to the surfaces of the substrate retainer 119 exposed to the process.

The process volume encasing 113 is preferably developed such that it is composed of multiple parts (not shown), such that it can be removed or exchanged without disassembling the configurations 117a, 117b.

By removing the process volume encasing 113 depicted in FIG. 5, a preferred embodiment of the process module type II is realized or by replacing the process volume encasing 113 with a likewise formed encasing of a metal, a process module of type II according to FIG. 3.

It should be repeated that in the process module of type I, preferably developed according to FIG. 5, phases $Ph_1$ and/or $Ph_2$ of the production method according to the invention are carried out, whereas preferably in modules of type II surface conditioning or cleaning steps are carried out preceding phase $Ph_1$ and/or succeeding phase $Ph_2$, preferably in a low-energy hydrogen plasma.

Figure 7:
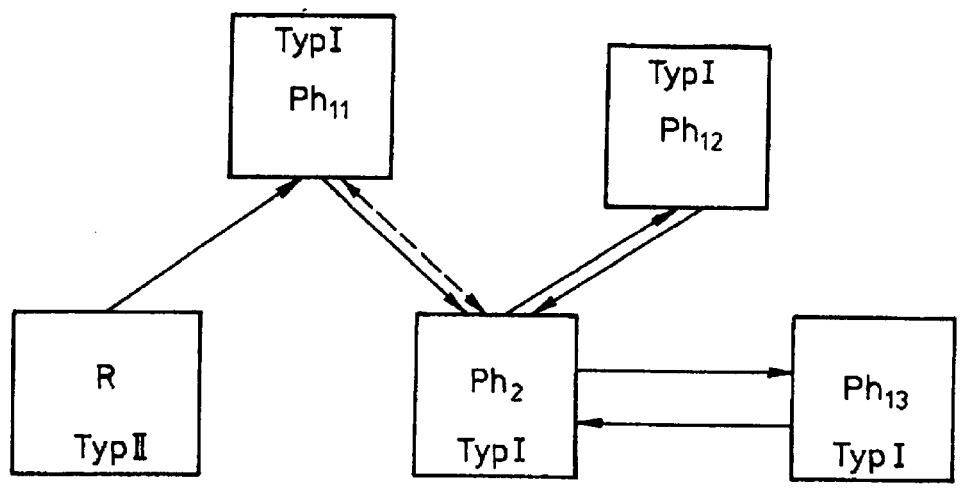
Figure 8:
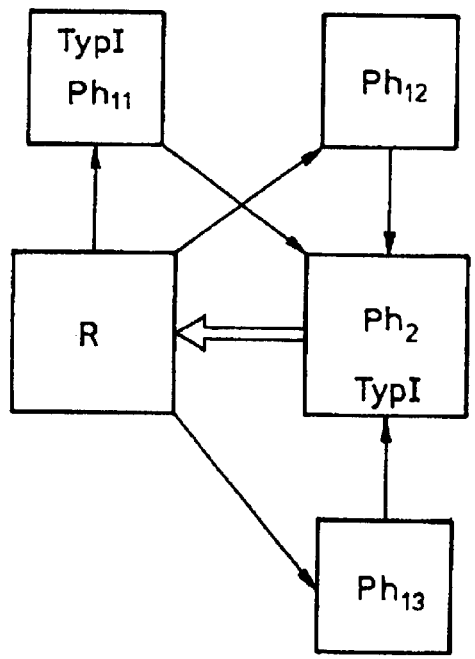

In FIGS. 7 and 8 in the form of flow charts two possible realization forms of the production method according to the invention are depicted. According to FIG. 7 several different atom monolayer are assumed to be deposited one above the other, for example in order to produce a heteroepitaxially grown coating. The substrates are first supplied to a cleaning module R, preferably developed according to modules type II, wherein, further preferred, surface cleaning takes place in a low-energy hydrogen plasma as defined. A substrate under consideration after cleaning R is supplied to a process module of type I, wherein the method phase $Ph_{11}$ with adsorption of a first reactive gas takes place. The substrate is subsequently supplied for the realization of phase $Ph_2$ to a process module, preferably of type I, with, as stated, gas inlet—inert gas and/or reactive gas—and low-energy plasma discharge. After carrying out phase $Ph_2$ the substrate is supplied to a further process module of type I and there charged with a further reactive gas or reactive gas mixture—$Ph_{12}$—to be adsorbed. Again, it is subsequently subjected in the central process module of type I to method phase $Ph_2$ in order to be subsequently optionally supplied to further process modules of type I where the substrate is subjected to further reactive gas mixtures or reactive gases, $Ph_{13}$, to be adsorbed.

Thereby, should epitaxial coatings be grown, heteroepitaxial coatings are deposited. If the substrate, as shown in dashed lines, moves back and forth between process phase $Ph_2$ and a process phase, such as for example $Ph_{11}$, in the case of epitaxial growth a homoepitaxial layer is grown.

In contrast to carrying out the method according to the invention according to FIG. 7, when carrying out the method according to FIG. 8, preferably after each deposition of an atom monolayer a cleaning step of the substrate surface is carried out. This cleaning step R can preferably always be developed identically to the cleaning step which is carried out on the substrate surface before it is even subjected to the first adsorption step according to a first method phase $Ph_{11}$. Thus, also after the deposition of an atomic monolayer, surface cleaning on the substrate is carried out in a low-energy plasma, preferably a low-energy hydrogen plasma. Let us again follow a substrate under consideration. After the cleaning in process R, it is supplied to a first process module of type I, where it adsorbs a first reactive gas or reactive gas mixture $Ph_{11}$. Subsequently it is supplied to a further process module of type I, in which the method phase $Ph_2$, i.e. plasma treatment is carried out optionally with the inclusion of ions and radicals of a second plasma-activated reactive gas, especially preferred of hydrogen and/or nitrogen and/or oxygen.

After completing this method phase $Ph_2$, the substrate is again supplied to the cleaning process R, preferably in a module of type II, subsequently to a further module of type I, where it adsorbs a further reactive gas or reactive gas mixture in phase $Ph_{12}$. It is subsequently supplied to cleaning step R, again via the method phase $Ph_2$, etc. It is here evident that at the output side of the modules carrying out process phases $Ph_{1x}$, a transport via a module carrying out phase $Ph_2$ to the cleaning module takes place from where, the process modules carrying out phase $Ph_{1x}$ are virtually centrally supplied with substrates.

These or similar, relatively complex process sequences are preferably carried out flexibly in a preferably freely programmable vacuum treatment installation within which a central transport module loads the particular process and conditioning or cleaning modules.

Figure 9:
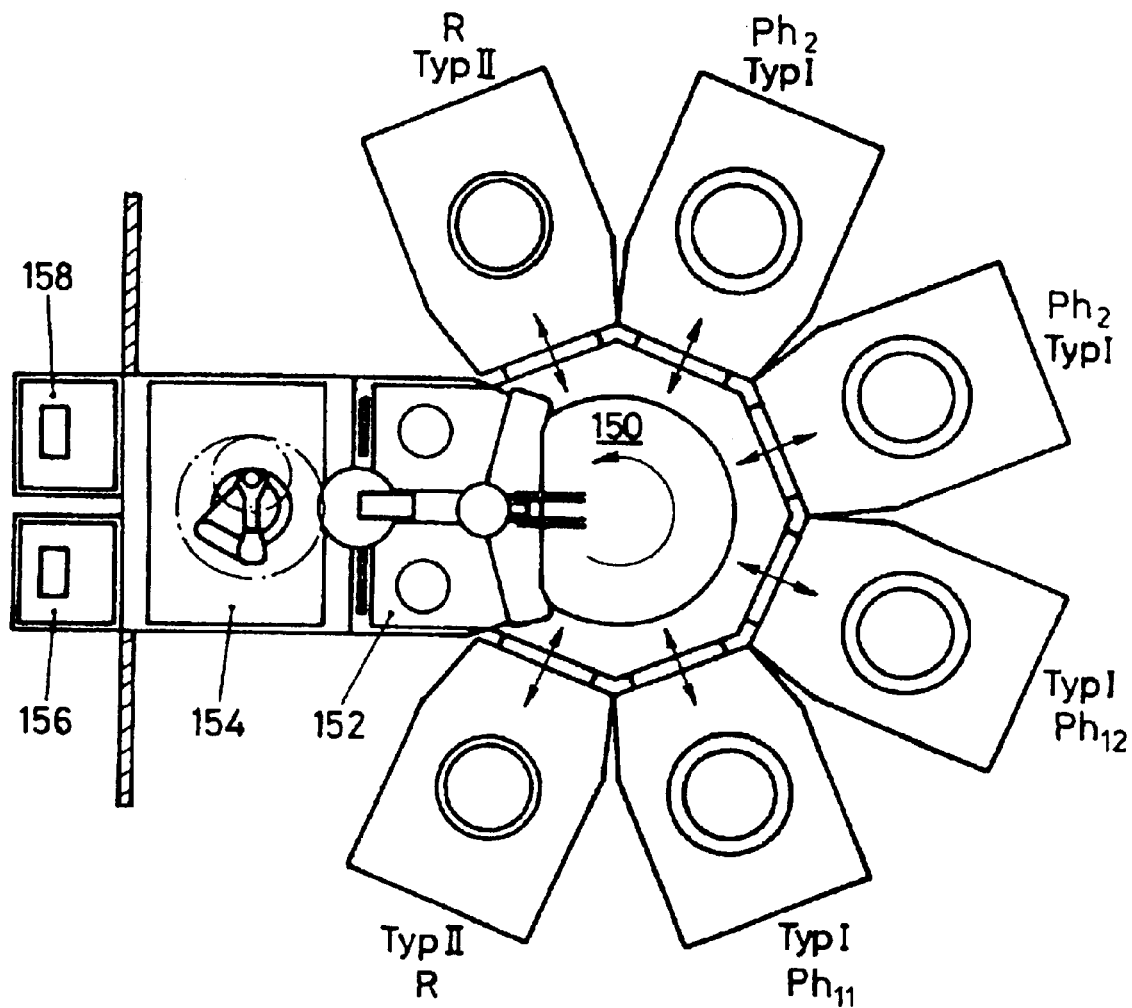

Schematically, and purely by example, such an installation is depicted in FIG. 9, with two cleaning modules R of type II, two modules of type I for carrying out method phases $Ph_2$ as well as two modules of type I for carrying out the method phases $Ph_{12}$ and $Ph_{11}$.

What is claimed is:

1. A method for producing substrates charged with materials, in which
   a) at least one substrate is introduced into an evacuated vacuum container;
   b) the surface of the substrate to be charged is exposed to a reactive gas which is adsorbed on the surface;
   c) the exposure of the surface to the reactive gas is terminated,
   d) the reactive gas adsorbed on the surface is allowed to react, and wherein
      $d_1$) the surface with the adsorbed reactive gas is exposed to a low-energy plasma discharge with ion energy $E_{IO}$ on the surface of the substrate of $$0 < E_{IO} \leq 20 \text{ eV}$$

and an electron energy $E_{eo}$ of $$0 \text{ eV} < E_{eo} \leq 100 \text{ eV};$$

$d_2$) the adsorbed reactive gas is allowed to react at least with the cooperation of plasma-generated ions and electrons.

2. The method as claimed in claim 1, wherein the plasma discharge is realized with an ion energy $E_{Io}$ on the surface of the substrate of $$0 \text{ eV} < E_{Io} \leq 15 \text{ eV}.$$

3. The method as claimed in claim 1, wherein the adsorbed reactive gas is a reactive gas mixture.

4. The method as claimed in claim 1, wherein the plasma discharge is maintained in an inert gas atmosphere.

5. The method as claimed in claim 4, wherein the plasma discharge is maintained in an argon atmosphere.

6. The method as claimed in claim 1, wherein the plasma discharge is generated in an atmosphere which contains a further reactive gas or gas mixture.

7. The method as claimed in claim 6, wherein the further reactive gas or gas mixture contains at least one of the gases hydrogen, nitrogen, oxygen.

8. The method as claimed in claim 6, wherein the further reactive gas or gas mixture comprises hydrogen.

9. The method as claimed in claim 6, wherein the further reactive gas or gas mixture consists of hydrogen.

10. The method as claimed in claim 1, wherein the vacuum container is evacuated to a pressure ($p_v$) for which applies:

$$10^{-11} \text{ mbar} \leq p_v \leq 10^{-8} \text{ mbar}.$$

11. The method as claimed in claim 1, wherein the reactive gas to be adsorbed is allowed to flow in up to a partial pressure $p_p$, for which applies:

$$10^{-4} \text{ mbar} \leq p_p \leq 1 \text{ mbar}.$$

12. The method as claimed in claim 1, wherein the gas adsorption rate on the surface is controlled by heating/cooling the surface.

13. The method as claimed in claim 1, wherein the exposure is terminated and the substrate is transferred from the evacuated vacuum container into a further evacuated vacuum container.

14. The method as claimed in claim 1, wherein the exposure of the surface is terminated by pumping out the remaining adsorbed reactive gases from the evacuated vacuum container.

15. The method as claimed in claim 14, wherein the reactive gas is pumped out until a pressure $p_v'$ is reached for which applies:

$$10^{-11} \text{ mbar} \leq p_v' \leq 10^{-8} \text{ mbar}.$$

16. The method as claimed in claim 1, wherein at least the steps b) to $d_2$) are completed at least twice.

17. The method as claimed in claim 1, wherein after carrying out at least one step $d_2$), a different material is applied onto the surface.

18. The method as claimed in claim 17, wherein the further material is applied by means of a vacuum coating process, by means of wet chemistry or galvanically.

19. The method as claimed in claim 1, wherein before the exposure of the surface to the reactive gas to be adsorbed, the surface is exposed to a low-energy inert gas plasma, with ion energies $E_{I1}$ on the surface of $$0 \text{ eV} < E_{I1} \leq 20 \text{ eV}$$

and an electron energy $E_{e1}$ of $$0 \text{ eV} < E_{e1} \leq 100 \text{ eV}.$$

20. The method as claimed in claim 1, wherein before the exposure of the surface to the reactive gas to be adsorbed, the surface is exposed to a low-energy plasma discharge in an atmosphere comprising a further reactive gas, where for the ion energy $E_{I2}$ applies:

$$0 \text{ eV} < E_{I2} < 20 \text{ eV},$$

at an electron energy $E_{e2}$ of $$0 \text{ eV} < E_{e2} < 100 \text{ eV}.$$

21. The method as claimed in claim 20, wherein the further reactive gas is at least one of the gases hydrogen, nitrogen, oxygen.

22. The method as claimed in claim 20, wherein the further reactive gas comprises hydrogen.

23. The method as claimed in claim 1, wherein after the reaction of the adsorbed reactive gas, the surface is exposed to a low-energy inert gas plasma, with an ion energy $E_{I3}$ on the surface of $$0 \text{ eV} < E_{I3} < 20 \text{ eV},$$

and an electron energy $E_{e3}$ of $$0 \text{ eV} < E_{e3} < 100 \text{ eV}.$$

24. The method as claimed in claim 1, wherein after the reaction of the adsorbed reactive gas, the surface is exposed to a low-energy plasma discharge in an atmosphere which comprises a further reactive gas, wherein for the ion energy $E_{I4}$ on the substrate surface applies:

$$0 \text{ eV} < E_{I4} \leq 20 \text{ eV},$$

and with an electron energy $E_{e4}$ of $$0 \text{ eV} < E_{e4} \leq 100 \text{ eV}.$$

25. The method as claimed in claim 24, wherein the further reactive gas is at least one of the gases hydrogen, nitrogen, oxygen.

26. The method as claimed in claim 24, wherein the further reactive gas comprises hydrogen.

27. The method as claimed in claim 1, wherein the surface charging takes place by means of at least one of the following materials:

oxides or nitrides or oxinitrides of Si, Ge, Ti, Ta, Hf, Zr, Al, Nb, W and/or of the following metals:
Al, Ti, Cu, W, Ta.

28. The method as claimed in claim 27, wherein the surface charging takes place by means of at least one of the following materials:

silicon oxide, tantalum oxide, zirconium oxide, titanium nitride, tantalum nitride, tungsten nitride, $(TaSi)_x N_y$.

29. The method as claimed in claim 1, wherein all method steps are carried out in one vacuum container.

30. The method as claimed in claim 1, wherein the method steps are carried out in at least two vacuum containers.

31. The method as claimed in claim 1, wherein the process atmosphere encompassing the surface of the substrate during at least one of the phases comprised of steps b) and c) and/or d) to $d_2$), is isolated from the inner wall of a vacuum container at ambient surroundings.

32. The method as claimed in claim 1, wherein the surface to be charged includes the surface of a substrate already charged or coated.

33. The method as claimed in claim 1, wherein the surface before the adsorption step and/or after the reaction of the adsorbed reactive gases or gas mixture is exposed to a plasma-enhanced cleaning step, in which in a reactive gas or gas mixture is activated by means of a low-energy plasma discharge with ion energy $E_r$ on the substrate surface of $$0\ eV < E_r \leq 20\ eV,$$

at an electron energy $E_{er}$ of $$0\ eV < E_{er} \leq 100\ eV.$$

34. The method as claimed in claim 33, wherein during the at least one cleaning step the cleaning process atmosphere is isolated by means of a metallic encapsulation from the inside wall of the cleaning vacuum container at ambient surrounding or this process atmosphere is directly delimited by the inside wall of a cleaning vacuum container at ambient surroundings.

35. The method as claimed in claim 1, wherein through a single sequence of steps a) to $d_2$) one atom monolayer is applied onto the surface.

36. The method as claimed in claim 1, wherein by repeating steps b) to d) an epitaxial layer is grown on, with a change of the reactive gas heteroepitaxial ones, without a change of the reactive gas homoepitaxial ones.

37. The method as claimed in claim 1, wherein after carrying out a fixed number of passes through steps b) to d) sequentially on several substrates the process volume of the vacuum container is subjected to a plasma-enhanced process volume cleaning step without an introduced substrate or with a substrate dummy, which process volume cleaning step first comprises an etching step, subsequently a cleaning step, in a plasma comprising hydrogen, inert gas or a mixture thereof.

38. The method as claimed in claim 1, wherein before step a) and/or after step $d_2$) the substrate is subjected to a substrate cleaning step after being spatially separated from the vacuum container and that the transport of the substrate there between is carried out under vacuum.

39. The method as claimed in claim 38, wherein the transport under vacuum takes place at least piecewise linearly or along a circular path, with linear guide movements to said containers, with motion components radial with respect to a circular path.

40. The method as claimed in claim 1, wherein during steps b) to and including d) the process atmosphere to which is exposed the surface is isolated from the inner wall of a vacuum container at ambient surrounding by means of a surface which in the new condition is chemically inert against the reactive gas or gas mixture and/or against a second plasma-activated reactive gas or gas mixture, by means of a dielectric or graphitic surface.

41. The method as claimed in claim 40, wherein the inert surface is the surface of a partition wall which is spaced apart from the inner wall of the vacuum container along predominant surface sections.

42. The method as claimed in claim 40, wherein the surface for isolation in the new condition is realized of at least one of the following materials:

quartz, graphite, silicon carbide, silicon nitride, aluminum oxide, titanium oxide, tantalum oxide, niobium oxide, zirconium oxide or a layered combination of these materials, in this case also with diamond-like carbon or diamond.

43. The method as claimed in claim 1, wherein the plasma discharge is realized with an electron source with electron energy $E_e \leq 50$ eV.

44. The method as claimed in claim 1, wherein the plasma discharge is realized by means of a thermionic cathode, with a directly heated thermionic cathode.

45. The method as claimed in claim 1, wherein in the process volume of the vacuum container for the plasma discharge at least two anodes spatially offset and each heatable are provided, each electrically actuatable separately and through the control of the electric potentials impressed thereon and/or their temperature the plasma density distribution along the surface is dynamically adjusted or controlled along the surface.

46. The method as claimed in claim 1, wherein during step d) in the process volume a magnetic field is generated and by means of this magnetic field the plasma density distribution along the surface is stationarily and/or dynamically adjusted or controlled, at least such that it wobbles locally.

47. The method as claimed in claim 1, wherein at least the reactive gas or gas mixture to be adsorbed is allowed to flow distributively into the process atmosphere, with a direction of inflow substantially parallel to the surface and, further, with injection sites equidistant from the surface.

48. The method as claimed in claim 1, wherein the substrate is a silicon oxide-coated substrate with grooves sunk into the silicon oxide layer, and that after carrying out n-times one of the steps $d_2$), copper is deposited in the grooves, where $n \geq 1$.

49. The method as claimed in claim 1, wherein before the exposure of the surface to the reactive gas to be adsorbed, the surface is exposed to a low-energy inert gas plasma, with ion energies $E_{i1}$ on the surface of $$0\ eV < E_{i1} \leq 15\ eV$$

and an electron energy $E_{e1}$ of $$0\ eV < E_{e1} \leq 100\ eV.$$

50. The method as claimed in claim 1, wherein before the exposure of the surface to the reactive gas to be adsorbed, the surface is exposed to a low-energy plasma discharge in an atmosphere comprising a further reactive gas, where for the ion energy $E_{i2}$ applies:

$$0\ eV < E_{i2} \leq 15\ eV$$

at an electron energy $E_{e2}$ of $$0\ eV < E_{e2} \leq 100\ eV.$$

51. The method as claimed in claim 1, wherein after the reaction of the adsorbed reactive gas, the surface is exposed to a low-energy inert gas plasma, preferably argon plasma, with an ion energy $E_{i3}$ on the surface of $$0\ eV < E_{i3} \leq 15\ eV$$

and an electron energy $E_{e3}$ of $$0\ eV < E_{e3} \leq 100\ eV.$$

52. The method as claimed in claim 1, wherein the surface before the adsorption step and/or after the reaction of the adsorbed reactive gases or gas mixture is exposed to a plasma-enhanced cleaning step, in which in a reactive gas or gas mixture—comprising hydrogen—it is activated by means of a low-energy plasma discharge with ion energy $E_r$ on the substrate surface of $$0\ eV < E_r \leq 15\ eV$$

at an electron energy $E_{er}$ of $$0\ eV < E_{er} \leq 100\ eV.$$

53. The method as claimed in claim 1, wherein after carrying out a selected number of passes through steps b) to d) sequentially on several substrates the process volume of the vacuum container is subjected to a plasma-enhanced process volume cleaning step without an introduced substrate or with a substrate dummy, and subsequently a cleaning step.

54. The method as claimed in claim 1, wherein the plasma discharge is realized with an electron source with electron energy $E_e \leqq 50$ eV, by means of a DC discharge.

55. The method as claimed in claim 1, wherein that the plasma discharge is realized by means of a thermionic cathode.

56. The method as claimed in claim 1, wherein in the process volume of the vacuum container for the plasma discharge, at least two anodes that are spatially offset from each other, are provided.

57. The method as claimed in claim 1, wherein at least the reactive gas or gas mixture to be adsorbed is allowed to flow distributively into the process atmosphere.

* * * * *